United States Patent [19]

Howard et al.

[11] 4,300,149
[45] Nov. 10, 1981

[54] GOLD-TANTALUM-TITANIUM/TUNGSTEN ALLOY CONTACT FOR SEMICONDUCTOR DEVICES AND HAVING A GOLD/TANTALUM INTERMETALLIC BARRIER REGION INTERMEDIATE THE GOLD AND ALLOY ELEMENTS

[75] Inventors: James K. Howard, Fishkill; James F. White, Newburgh, both of N.Y.

[73] Assignee: International Business Machines Corporation, Armonk, N.Y.

[21] Appl. No.: 72,706

[22] Filed: Sep. 4, 1979

[51] Int. Cl.³ .................... H01L 23/48; H01L 29/46; H01L 29/54
[52] U.S. Cl. ........................ 357/71; 357/65; 357/67; 357/15
[58] Field of Search ................ 357/65, 67, 15, 71

[56] References Cited

U.S. PATENT DOCUMENTS

| | | | |
|---|---|---|---|
| 3,769,688 | 11/1973 | Kessler et al. | 357/67 |
| 4,104,697 | 8/1978 | Kendall et al. | 357/67 |
| 4,141,022 | 2/1979 | Sigg et al. | 357/67 |
| 4,166,279 | 8/1979 | Gangulee et al. | 357/67 |
| 4,171,528 | 10/1979 | Kling | 357/67 |
| 4,179,533 | 12/1979 | Christou et al. | 357/71 |
| 4,214,256 | 7/1980 | Dalal et al. | 357/67 |

Primary Examiner—Andrew J. James

[57] ABSTRACT

In a conductor pattern for integrated circuits, the use of barrier layers of TiW and selected transition metals between gold and a silicon substrate, with the transition metal containing a supplemental barrier region or stratum of an intermetallic formed between it and the gold. Also comprehended is the use of a platinum silicide layer between the TiW layer and silicon for Schottky Barrier Diodes.

11 Claims, 8 Drawing Figures

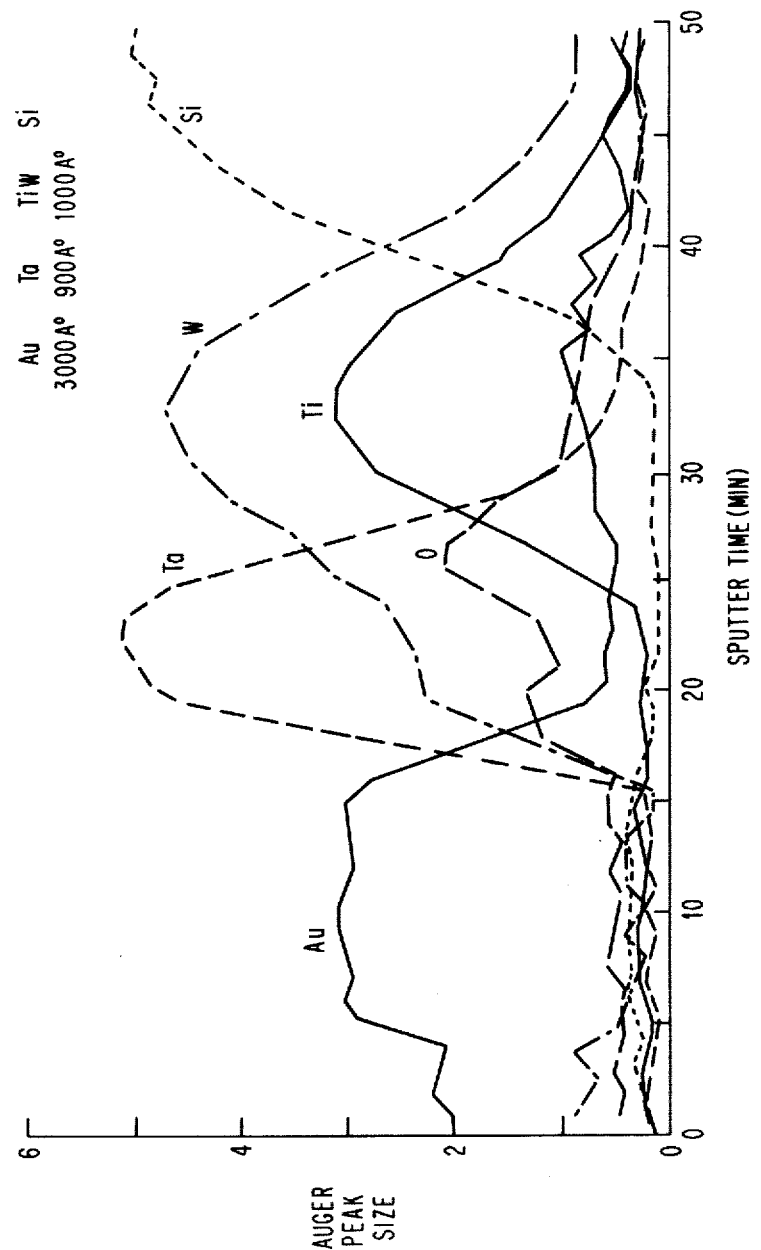

GOLD-TANTALUM-TITANIUM/TUNGSTEN ALLOY CONTACT FOR SEMICONDUCTOR DEVICES AND HAVING A GOLD/TANTALUM INTERMETALLIC BARRIER REGION INTERMEDIATE THE GOLD AND ALLOY ELEMENTS

DESCRIPTION

1. Technical Field

This invention relates to semiconductors in general, and more particularly to improved gold conductor contact structures for semiconductors.

One object of this invention is to provide an improved gold conductor contact.

Another object of this invention is to provide a semiconductor device employing gold as a conductor.

Another object of this invention is to provide an improved gold conductor pattern, with improved electromigration resistance, for use in integrated semiconductor circuits.

Another object of this invention is to provide a metallurgy system for gold which provides electromigration improvement and diffusion barrier properties required for integrated circuit devices.

2. Background Art

This narrow conductive films or lines and contacts have been used for some years for device contact and interconnection purposes for semiconductors and integrated circuits. As such devices become smaller and smaller, the size of the conductive patterns must be reduced. As a result of size reduction, the current density carried by the conductors and contacts has been increased. At the higher current densities, the conductor patterns are subject to a mode of failure called electromigration which severly limits the reliability of the resulting circuit. A detailed description of the electromigration phenomena is set forth in U.S. Pat. No. 4,017,890 issued on Apr. 12, 1977 to J. K. Howard et al. and U.S. Pat. No. 4,166,275 issued on Aug. 28, 1979 to A. Gangulee, whose teachings are incorporated herein by reference thereto.

Thus, in forming the first level metallization for integrated circuits, it is necessary to utilize a metal capable of conducting a high current due to the thinness of the conductive pattern. The metal must also be capable of adhering to electrically insulating layers on which the metal must be supported. In addition, the metal must not have any effect on the various junctions and diffused regions formed within the substrate of the semiconductor device.

Gold has a high conductivity and is capable of conducting a high current density. However, gold will not adhere to silicon dioxide so that gold cannot be employed directly by itself as the first level metallization. Also, the use of gold metallurgy for interconnection in integrated circuit structures requires a diffusion barrier to prevent gold from diffusing into the underlying semiconductor substrate, particularly when it is silicon. It is known that gold doped silicon exhibits a significant reduction in minority carrier lifetime, but more important, the silicon-gold eutectic is at 370° C. and thus the possible formation of liquid alloy exists when the device is heat cycled.

It has been previously suggested (see U.S. Pat. No. 3,717,563 issued Feb. 20, 1973 to M. Revitz et al. and U.S. Pat. No. 3,900,944 issued Dec. 19, 1973 to C. R. Fuller et al.) to employ tantalum between gold and silicon dioxide as well as in contact structures for silicon substrates. The said U.S. Pat. No. 3,900,944 also proposes to employ a TiW layer for a like purpose. It was also assumed that since TiW and tantalum formed diffusion barriers between gold and the silicon substrate this would prevent gold from affecting the various junctions and regions in the silicon substrate. However, it has been found that gold diffuses rapidly through TiW and tantalum layers at 400° C., which defeats their use as diffusion barriers. Also TiW layers are heavily stressed when temperature cycled which can cause cracks through a TiW layer which enables gold to penetrate to the substrate where it can react with silicon.

The aforesaid U.S. Pat. No. 4,166,275 proposes to solve the problem of electromigration by use of a composite wherein a gold layer is interposed or sandwiched between two tantalum layers, one of which is supported directly on a substrate. This composite is heated to induce a reaction between gold and the tantalum to form an intermetallic therebetween. Although the composite metallization appears to provide an adequate solution for use on dielectric (e.g. SiO$_2$) surfaces, there is a question of vulnerability to high temperature cycling where such a composite is disposed directly in contact with portions of a silicon substrate. There is the possibility that the gold will diffuse through the tantalum layer to the substrate, which if it is silicon, it will react or alloy with gold.

Other teachings to adapt gold for conductive metallization can be found in (a) U.S. Pat. No. 3,617,816 which shows a composite Ta/Au/Ta conductor; (b) U.S. Pat. No. 3,808,041 which shows a composite Pt/Au/Pt conductor; and U.S. Pat. No. 3,893,160 which shows a composite Ti/Mo/Au conductor.

BRIEF DESCRIPTION OF THE DRAWINGS

FIGS. 4 to 6 are graphs showing data obtained in evaluation of this invention.

DISCLOSURE OF INVENTION

For further comprehension of the invention, and of the objects and advantages thereof, reference will be had to the following description and accompanying drawings, and to the appended claims in which the various features of the invention are more particularly set forth.

Briefly, the present invention solves the foregoing problems by depositing on the semiconductor substrate a composite metallization formed by sequential layer deposition of TiW (e.g. 10 wt.% Titanium and 90 wt.% Tungsten), Ta (Tantalum) and Au (Gold). The unit is then annealed at elevated temperatures for sufficient time to form in the tantalum layer a region of intermetallic or a compound of gold and tantalum (AuTa). At elevated temperatures there is an interdiffusion between gold and tantalum at temperatures of about 350° C., with the diffusion above 350° C. being gold into tantalum. The gold will react with tantalum to form an AuTa intermetallic at the Au grain boundaries and therebetween at the Ta-TiW interface where it will pile up close to the TiW barrier layer. An accompanying advantage of the composite is, that tantalum will fill any cracks or rifts in the TiW layer where it will react with gold to form the AuTa intermetallic compound.

As utilized herein, the term "intermetallic compound" represents more than a mere mixture in the form of an alloy. Rather, the term refers to a substance composed of atoms of two different elements with definite proportions by atoms of the constituent elements, which may be best represented by a chemical formula. For further details relating to intermetallic compounds reference is made to the definitions thereof set forth in "Elements of Physical Metallurgy" by A. G. Guy, published by Addison-Wesley (1951).

Also, although the invention has wide application, it has specific and immediate interest to the fabrication of semiconductor devices formed in an oxidized monocrystalline silicon substrate having contact via holes in the oxide for access to underlying portions of the substrate. The semiconductor devices can comprise transistors, charge coupled devices, Schottky Barrier Diodes (SBD) and other electronic components or discrete and intergrated devices reguiring high quality metallization to semiconductor junctions or interfaces. In such applications the gold composite metallization can be employed for an interconnection network, ohmic contacts as well as for Schottky Barrier Diode metallurgy.

Best Mode for Carrying Out the Invention

Figure 1:
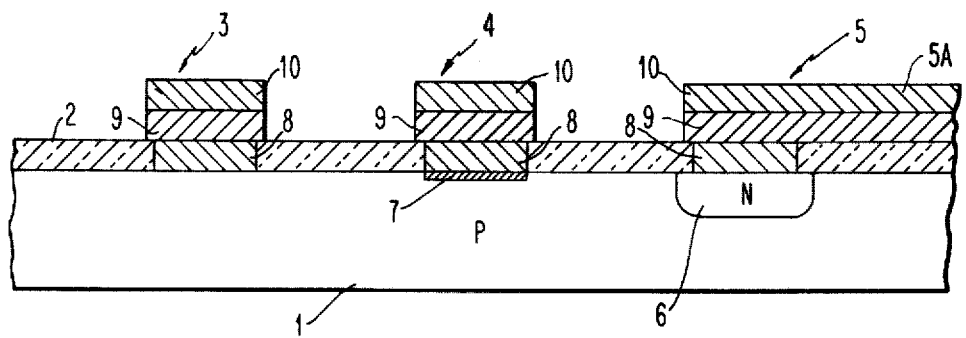
FIGS. 1 to 3 are schematic drawings in section illustrating various applications of the metallization of this invention, as well as stages in the fabrication of a contact structure.

Referring to FIG. 1, in particular, there is shown a substrate 1 which in an illustrative application is comprised of monocrystalline silicon which is normally oxidized to provide an overlying dielectric layer 2, as for example, silicon dioxide, and optionally where required, the oxide layer can be overcoated with silicon nitride or other supplemental dielectric material. The substrate 1, as illustratively comprehended in this invention, is employed for the fabrication of semiconductor devices; and thus the substrate is comprehended to comprise an integrated circuit having active and passive devices fabricated therein (not shown) and means for electrically isolating the devices from each other. Also, although the invention has broad application, inclusive of the fabrication of ohmic contacts and interconnection metallurgy, the invention will be specifically described with reference to the fabrication of a contact for a low barrier SBD as shown at 3. Accordingly, it is to be understood that the invention can also be employed to form high barrier SBD's at 4, and ohmic contacts with an interconnecting pattern as at 5 for diffused regions 6 which can comprise exposed portions of emitter, base and collector elements of transistors. Conversely, as will be evident, diffused regions 6 can comprise source and drain elements of FETs.

In such application, the dielectric layer 2 will have a number of contact openings or via holes for making contact to active and passive devices as well as for the fabrication of SBDs on the surface of the silicon substrate 1. In further illustration of the application of the invention, the composite metallization element 4 is shown as a contact for a high barrier SBD having a platinum silicide layer 7 which can be formed by conventional techniques. This can be formed by evaporative or sputter deposition of a thin e.g. 500Å of platinum, followed by heat treatment, e.g. about 500° C., in an inert atmosphere, e.g. nitrogen, to form the platinum silicide. The platinum reacts only with the monocrystalline material, while no reaction takes place with the oxide of the dielectric layer 2. After heat treatment, the unreacted platinum, e.g. on the oxide, can be removed by a suitable solvent, e.g. aqua regia, which does not attack the platinum silicide.

Each of the composite conductive elements 3, 4 and 5 (as well as element's 5 interconnection extension 5A) is comprised sequentially of a TiW layer 8, a transition metal layer 9 (selected from the group of tantalum, niobium, hafnium and zirconium and a gold layer 10. The personalization or definition of the conductive elements can be formed by means of various conventional techniques. For example, lift-off masks can be employed over which the metal constituents are sequentially deposited, or these metal constituents can be initially blanket coated on the substrate followed by wet and dry etching (e.g. reactive ion etching) techniques.

The contact elements 3, 4 and 5 can be formed by blanket deposition of a TiW barrier layer over the substrate in a thickness normally in the range of about 300Å to about 1500Å, as for example 1000Å, by any suitable method, as by vacuum evaporation or, preferably, by sputtering such as in the Perkin-Elmer Ultek 4400 Production Sputtering System tool.

In the next operation, a 300 to about 1500Å, e.g. about 1000°Å, film of transition metal Tx of tantalum, niobium, hafnium or zirconium is blanket deposited over the TiW layer, again by evaporation or sputtering techniques. After deposition of the transition metal, a film of gold of about 2000 to about 10,000Å, e.g. 2400°Å is blanket deposited over the tantalum, also by evaporation or preferably by sputtering techniques.

At this point, the composite blanket coatings of TiW-Tx-Au may be personalized by masking and etching techniques into the conductive elements 3, 4 and 5. Alternatively, where lift-off techniques are employed, the blanket metallization will have been effected on predefined resist masks (e.g. by electron beam or photolithography), which can now be chemically removed (lift-off) in a suitable solvent leaving the conductor elements 3, 4 and 5. Likewise, the blanket deposited metal composite can be removed by reactive ion etching using appropriately patterned dry etch masks.

Figure 2:
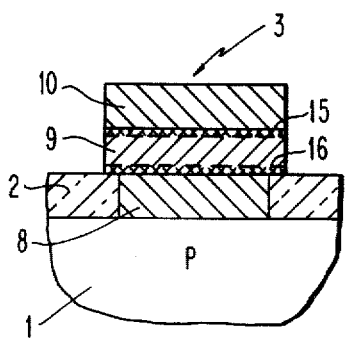

In any event, the substrate having the composite TiW-Tx-Au metallization is heated or annealed to interreact the gold and the transition metal. The annealing is accomplished by heating the composite to a temperature between about 300° C. and about 525° C., and holding at temperature for a time sufficient to form the gold transition metal compoundsor intermetallics. During annealing the gold to temperatures of about 350° C., it is believed that the main diffusion involves the transition metal, e.g. Ta, into gold, with some diffusion of gold into the transition metal. As temperatures increase above 350° C., the diffusion of gold into the transition metal increases, where gold forms an intermetallic with the transition metal at the interface of the TiW and transition metal where it piles up close to the TiW barrier layer. Concurrently, the transition metal also fills up any cracks or pinholes in the TiW layer where it reacts to an intermetallic with gold. As shown in FIG. 2, the gold intermetallic is shown as forming barrier regions 15 and 16 in the transition metal layer 9.

Figure 2A:
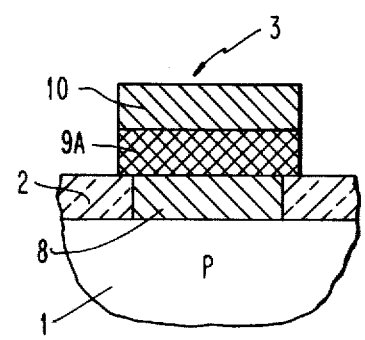
FIG. 2A is a schematic drawing in section illustrating a variation of the embodiment of the structure in FIG. 2 above.

As shown in FIG. 2A, the transition metal layer 9 can be substituted by an intermetallic layer 9A of gold and the transition metal, in a thickness of about 300Å to about 1500Å. This intermetallic can be formed over the TiW layer 8 by any suitable technique, preferably RF sputtering form a pre-alloyed target of the material, as for example, a pre-alloyed target of gold and tantalum. However, it is to be understood that evaporation or co-deposition from two sources can also be used to prepare the intermetallic phase.

After the film 10 of gold has been deposited on the tantalum film and annealed, an adhesion promoting film (not shown), e.g. Ta and/or TiW, can be deposited followed by deposition of a dielectric layer (not shown) e.g. SiO$_2$, and adhered thereto to form the electrically insulating layer on which second level metallization can be deposited.

Figure 3:
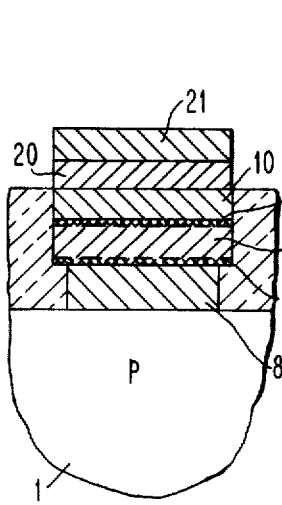
Figure 3A:
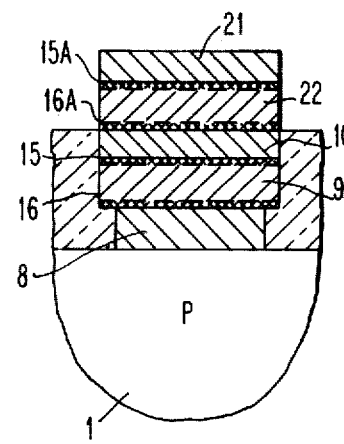
FIG. 3A and 3B are schematic drawings illustrating different embodiments of the contact structure in FIG. 3 above.
Figure 3B:
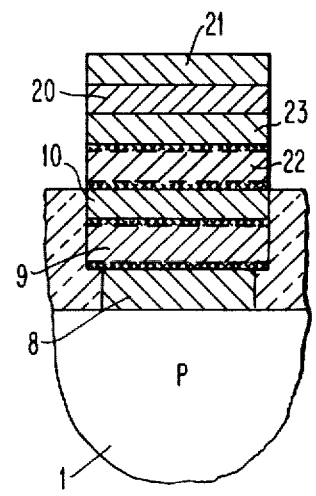

FIGS. 3, 3A and 3B show the adaptation of the metallurgy for the formation of solder contacts or pads to prevent gold of the basic metallurgy from interaction with the solder and/or with copper. The simplest version is shown in FIG. 3 which basically incorporates the teachings of U.S. Pat. No. 3,401,055, granted Sept. 10, 1968 to J. L. Langdon et al., and the IBM Technical Disclosure Bulletin article "Metallurgy Barrier for Au and Pb" by M. Revitz et al., p. 3358, vol. 14, No. 11, April 1972. To this end a metallurgy barrier 20 is applied on gold layer 10, which comprises sequential deposition of chrome, copper and gold films, over which is deposited a solder layer 21. In this environment the chrome film is employed for adherence to glass, silicon oxide and as a protection barrier for chrome, the copper film readily solders to chrome, and the gold film prevents oxidation of the copper film. In FIG. 3A increased protection for the gold metallurgy of this invention is provided by incorporation of a tantalum layer 22, which on annealing or heat treatment, will react with gold to form the intermetallic barrier regions 15A and 16A. An additional level of protection may be achieved as shown in FIG. 3B by inclusion of an addition barrier layer 23 of TiW between the tantalum layer 22 and the metallurgy barrier 21, e.g. between the tantalum layer 22 on the chrome film of metallurgy layer 21.

For evaluation of the gold composite metallization of this invention, resistance measurements of evaporated deposition layers of 2400 Å Au/1000 Å Ta or Nb/1000 Å TiW layers, on silicon, were compared to 2400 Å Au/1000 A Ta or Nb composites, on silicon, to determine the percent increase in resistance ($\Delta R\%$) with anneal temperature (all at 1 hour) as a measure of gold loss, by diffusion, through the barrier region. The results are shown in the following Table I:

TABLE I

| | | $\Delta R\%$ | | | |
|---|---|---|---|---|---|
| | 300° C. | 350° C. | 400° C. | 450° C. | 500° C. |
| 1. Au/Nb | 0 | +21 | +450 | | |
| 2. Au/Ta | −7.7 | −4.4 | +277 | | |
| 3. Au/Nb/TiW* | 0 | 0 | +29 | +50 | +125 |
| 4. Au/Ta/TiW | 0 | — | +3.4 | +12.6 | |

*Au/Nb reacts more readily to form Au$_2$Nb than Au/Ta reacts to form TaAu, thus $\Delta R\%$ is greater for Au/Nb than for Au/Ta.

Auger analysis of Au/Nb/TiW and Au/Ta/TiW after the 450° C. anneal showed that the Au/Nb reaction (to form the intermetallic phase) was more extensive than for the Au/Ta, thus the greater the $\Delta R\%$. However, the Auger data showed no difference between the metallurgy structures regarding gold penetration into silicon. It is thus extrapolated that the Au-Nb reaction, to form an intermetallic phase, limited gold diffusivity.

Also the diffusion barriers of Au/Ta/TiW/Si structures were compared to Au/Ta/Si and Au/TiW/Si structures. The thickness ratios of the evaporated Au:Ta:TiW was approximately 3000 Å:800 Å:1000 Å. Also the layer thicknesses of the Au:Ta and Au:TiW layers was respectively, 3000 Å:800 Å and 3000 Å:1000 Å. The metallurgy consisted of uniform films of the composite layers on freshly cleaned <100> silicon substrates. The reaction and interdiffusion of gold with the barrier layers and silicon was determined by several techniques:

(a) sheet resistance changes (macroscopic reaction)
(b) Auger spectroscopy (interdiffusion), and
(c) Transmission electron microscopy (TEM) and scanning electron microscopy (SEM) (phase formation and microstructure).

Table II below includes the results of a TEM-SEM study.

TABLE II

| AuSi Reaction of Barrier Metallization (TEM-SEM analysis) after Specified Anneal for One Hour) | | | | | |
|---|---|---|---|---|---|
| | 300° C. | 350° C. | 400° C. | 450° C. | 500° C. |
| Au/Ta | NO | YES | → | → | → |
| Au/TiW | NO | NO | YES* | → | → |
| Au/Ta/TiW | NO | NO | NO | NO | NO |

*based on optical examination of silicon substrates after anneal and metal strip.

The AuSi reaction can be detected after anneal, e.g. reaction zones, in the form of faceted pits are observed in the silicon. An indentation of the metal film occurs over the pits in the silicon. The TEM-SEM data suggests that Au-Si reaction can be prevented with Ta/TiW barrier layers for heat treatments of 500° C. (for one hour) or more.

Figure 5:
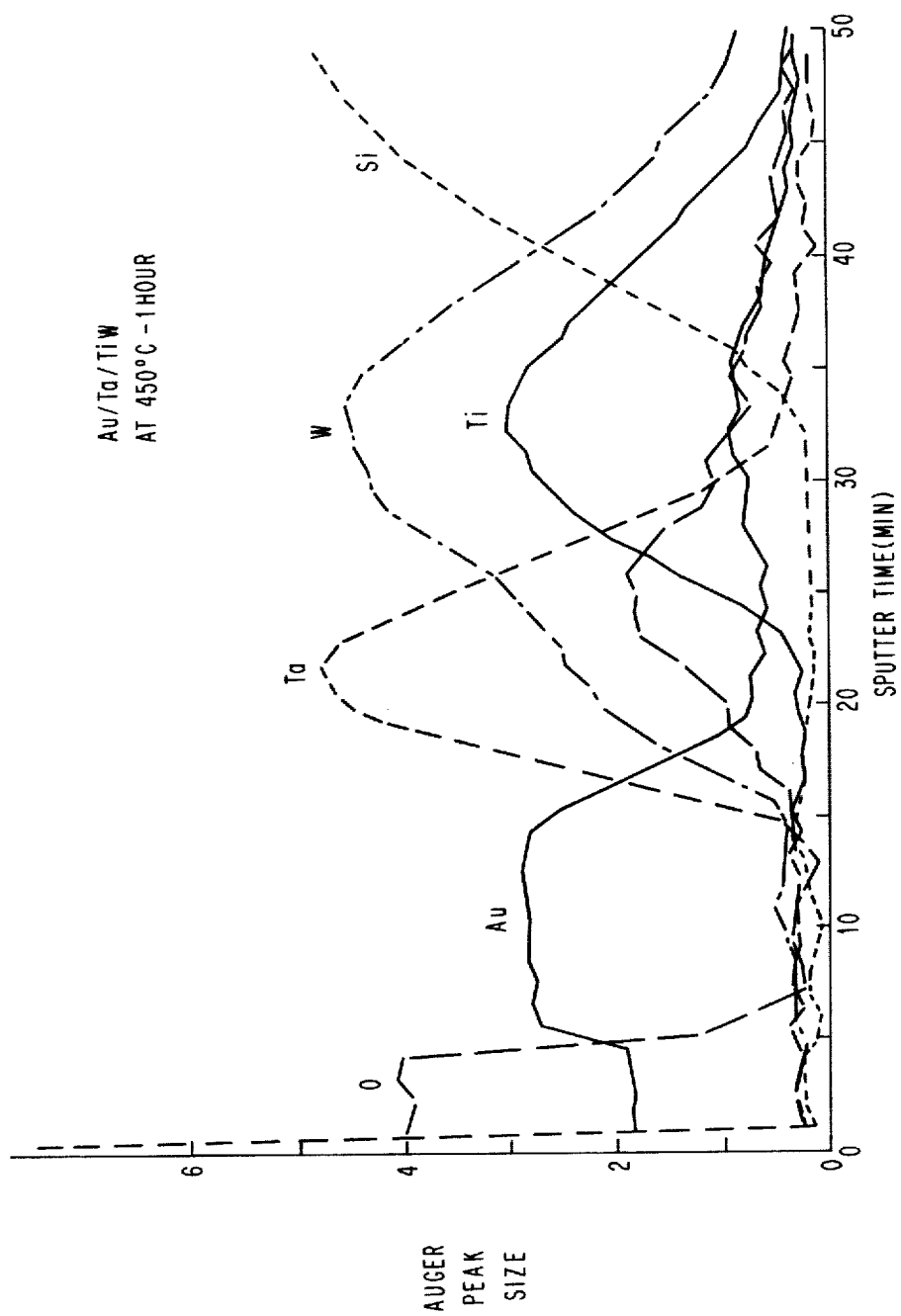

Auger data was obtained from chips (sections) of the samples used in the TEM-SEM study. A composition depth profile of the Au/Ta/TiW/Si sample (before anneal is shown in FIG. 4). Following an anneal at 450° C.-one hour, the composition-depth profile (FIG. 5) shows the Au signal to be unchanged, i.e. no gold pile-up at the TiW-Si interface. Thus the Au-Si reaction is prevented by the Ta/TiW barrier layer for heat treatments of at least 450° C.

Figure 6:
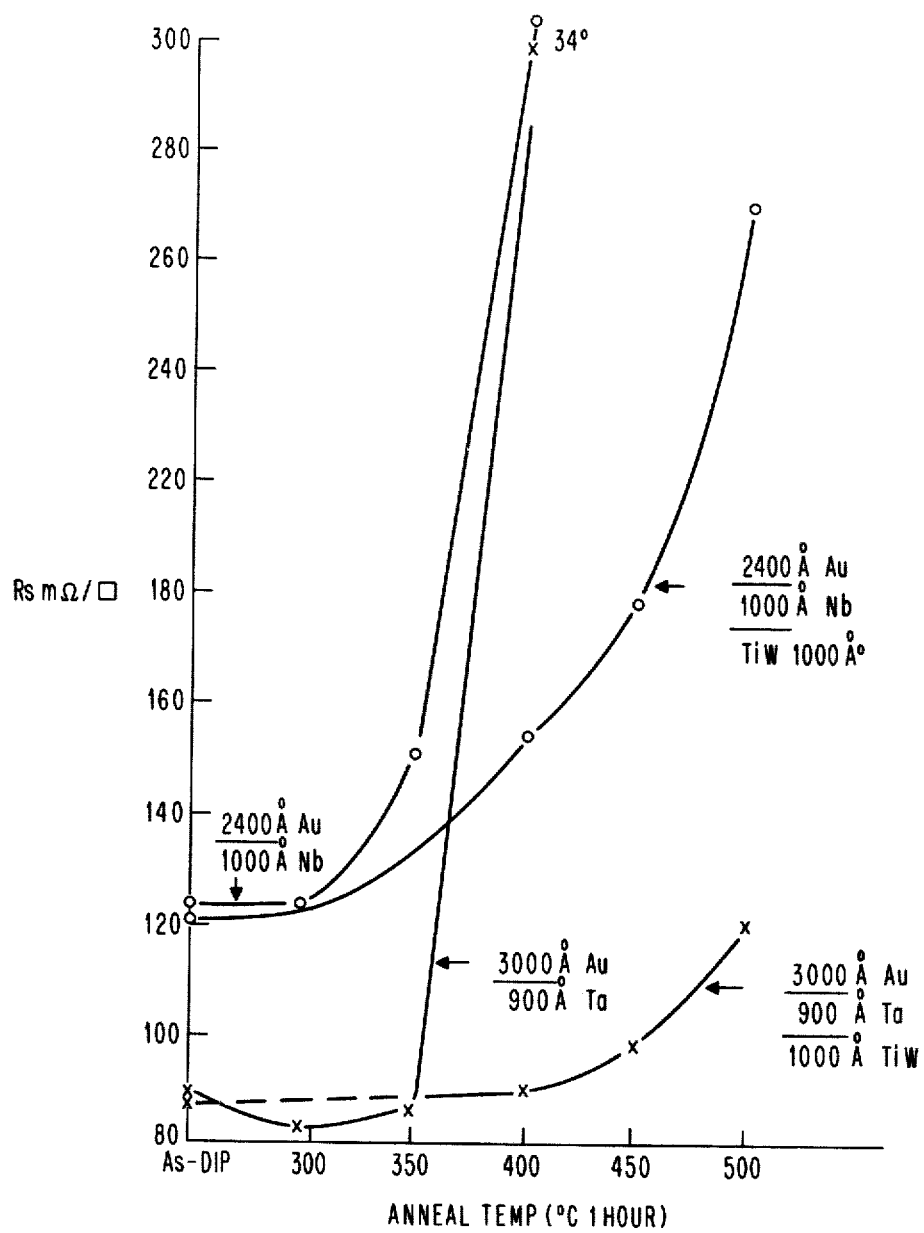

Sheet resistance measurements of Au/Ta/TiW/Si, Au/Ta/Si, Au/Nb/TiW/Si and Au/Nb/Si structures are shown in FIG. 6. It may be noted that both the Au/Ta/Si and Au/Nb/Si samples exhibit catastrophic breakdown at 400° C. (large increase in resistance due to Au-Si eutectic reaction).

However, the Au/Ta/TiW samples showed only about a 30% increase in total resistance after anneals at 300° C., 350° C., 400° C., 450° C. and 500° C. at one hour (the same film was used to generate the data in FIG. 6). The small increase in resistance is attributed to the formation of the AuTa phase (identified by TEM) rather than Au-Si reaction.

While the invention has been particularly shown and described with reference to the preferred embodiments thereof, it will be understood by those skilled in the art that the foregoing and other changes in form and detail may be made therein without departing from the spirit and scope of the invention.

Having thus described my invention, what I claim as new, and desire to secure by Letters Patent is:

1. A conductive contact structure for a semiconductor substrate comprising:

(a) a contact layer, adjacent said substrate, of an alloy of titanium and tungsten,
(b) a barrier layer over said contact layer, comprised stratum of a coextending barrier region of an intermetallic compound of gold and a transistion metal wherein said transition metal is selected from the group consisting of tantalum, hafnium, zirconium and niobium, and
(c) a layer of gold over said barrier layer.

2. The contact structure of claim 1 wherein said substrate is silicon and the contact layer is in contact therewith.

3. The contact structure of claim 2 including a Schottky Barrier contact of platinum silicide between said contact layer and said substrate.

4. The contact structure of claim 1 wherein said substrate is silicon and includes semiconductor devices therein.

5. The contact structure of claim 4 wherein said contact layer contacts an element of at least one of said devices.

6. The contact structure of claim 1 wherein said barrier layer comprises a layer of said transition metal containing said barrier region therein.

7. The contact structure of claim 6 wherein said substrate is silicon and the contact layer is in contact therewith.

8. The contact structure of claim 7 including a Schottky Barrier contact of platinum silicide between said contact layer and said substrate.

9. The contact structure of claim 6 wherein said substrate is silicon and includes semiconductor devices therein.

10. The contact structure of claim 9 wherein said contact layer contacts an element of at least one of said devices.

11. The contact structure of claim 1, 2, 3, 4, 5, 6, 7, 8, 9 or 10 wherein said transistion metal is tantalum.

* * * * *